(12) United States Patent
He et al.

(10) Patent No.: US 11,853,898 B1
(45) Date of Patent: Dec. 26, 2023

(54) DIRECT CURRENT (DC)/DC CONVERTER FAULT DIAGNOSIS METHOD AND SYSTEM BASED ON IMPROVED SPARROW SEARCH ALGORITHM

(71) Applicant: WUHAN UNIVERSITY, Wuhan (CN)

(72) Inventors: Yigang He, Wuhan (CN); Yingying Zhao, Wuhan (CN); Zhikai Xing, Wuhan (CN); Xiaoyu Liu, Wuhan (CN); Xiao Wang, Wuhan (CN)

(73) Assignee: WUHAN UNIVERSITY, Wuhan (CN)

(*) Notice: Subject to any disclaimer, the term of this patent is extended or adjusted under 35 U.S.C. 154(b) by 0 days.

(21) Appl. No.: 18/060,582

(22) Filed: Dec. 1, 2022

(30) Foreign Application Priority Data

Jun. 7, 2022 (CN) .......................... 202210639081.4

(51) Int. Cl.
*G06N 3/08* (2023.01)
*G06N 3/086* (2023.01)
*G01R 31/28* (2006.01)

(52) U.S. Cl.
CPC ......... *G06N 3/086* (2013.01); *G01R 31/2848* (2013.01)

(58) Field of Classification Search
CPC ......... H02M 3/33569; H02M 3/33573; H02M 3/33576; H02M 3/33515; G01R 31/2846; G01R 31/2848; G06F 30/27; G06N 7/06; G06N 3/08
See application file for complete search history.

(56) References Cited

U.S. PATENT DOCUMENTS

| | | | |
|---|---|---|---|
| 6,132,724 A | 10/2000 | Blum et al. | |
| 9,354,122 B2 | 5/2016 | Bieberich et al. | |
| 10,274,383 B2 | 4/2019 | Bieberich et al. | |
| 2003/0163296 A1* | 8/2003 | Richards | H02P 21/16 703/14 |
| 2019/0242936 A1* | 8/2019 | He | B60L 3/12 |
| 2020/0285900 A1* | 9/2020 | He | G06N 3/047 |
| 2021/0384816 A1* | 12/2021 | Xiao | H02M 1/32 |

* cited by examiner

*Primary Examiner* — Alex Torres-Rivera
(74) *Attorney, Agent, or Firm* — True Shepherd LLC; Andrew C. Cheng

(57) ABSTRACT

A DC/DC converter fault diagnosis method based on an improved sparrow search algorithm, includes: establishing an simulation module of the converter, selecting a leakage inductance current of a transformer as a diagnosis signal, and collecting diagnosis signal samples under OC faults of different power switching devices of the converter as a sample set; improving a global search ability of a sparrow search algorithm by using a Levy flight strategy; dividing the sample set into a training set and a test set, preliminarily establishing an architecture of a deep belief network, and initializing network parameters; optimizing a quantity of hidden-layer units of the deep belief network by using an improved sparrow search algorithm, to obtain a best quantity of hidden-layer units of the deep belief network; and training an optimized deep belief network obtained based on the improved sparrow search algorithm, and obtaining a fault diagnosis result based on a trained network.

1 Claim, 4 Drawing Sheets

DIRECT CURRENT (DC)/DC CONVERTER FAULT DIAGNOSIS METHOD AND SYSTEM BASED ON IMPROVED SPARROW SEARCH ALGORITHM

CROSS-REFERENCE TO RELATED APPLICATIONS

This application claims priority to Chinese Patent Application No. 202210639081.4 with a filing date of Jun. 7, 2022. The content of the aforementioned application, including any intervening amendments thereto, is incorporated herein by reference.

TECHNICAL FIELD

The present disclosure relates to the technical field of fault diagnosis of power electronic circuits, and in particular, to a direct current (DC)/DC converter fault diagnosis method and system based on an improved sparrow search algorithm.

BACKGROUND

A DC/DC converter has characteristics of electrical isolation and bidirectional energy flowing, and its reliable operation is crucial. At present, fault diagnosis of the DC/DC converter is mainly to diagnose an open circuit (OC) fault of a power switching transistor. Methods for diagnosing an OC fault of a power switching device are mainly classified into a model-based method and a data-driven method.

For a dual-active-bridge converter, a fault diagnosis method based on an analytical model is difficult to establish an accurate mathematical model. In the data-driven method, no mathematical model needs to be established, but a corresponding relationship between each fault state and a data sample is learned by using various machine learning algorithms. A support vector machine, an extreme learning machine, and other shallow networks are widely used in fault diagnosis. However, this kind of shallow learning cannot mine a deep feature of a fault sample, and fault diagnosis accuracy is relatively low. A deep learning model has a strong feature extraction ability, which can explore a corresponding relationship between a fault feature and a corresponding fault type layer by layer. At present, a deep belief network is widely used. Compared with a convolutional neural network, the deep belief network has fewer hyper-parameters, and can achieve higher diagnosis accuracy under an optimal network parameter setting. Performance of the deep belief network is related to a hyper-parameter setting of the network. A parameter that has greatest impact on the performance of the deep belief network is a quantity of hidden-layer units, so this parameter needs to be optimized. Most parameters are optimized by conducting many experiments, but this method is difficult to realize when there are many parameters. An optimization algorithm can realize parameter optimization, and most optimization algorithms are easy to fall into a local optimal solution when solving a parameter optimization problem. Although the optimization algorithm can optimize the parameters, there are still some problems such as long calculation time, low accuracy, and falling into the local optimal solution. Therefore, the corresponding optimization algorithm needs to be improved.

SUMMARY

In order to overcome the defects in the prior art, the present disclosure provides a DC/DC converter fault diagnosis method and system based on an improved sparrow search algorithm, to improve a sparrow search algorithm, thereby improving a global optimization ability of the sparrow search algorithm, preventing overfitting and a local optimal value of a deep belief network, and improving fault diagnosis accuracy of the network.

The present disclosure resolves the technical problems with the following technical solution:

The present disclosure provides a DC/DC converter fault diagnosis method based on an improved sparrow search algorithm, including the following steps:

step 1: establishing a simulation module of a DC/DC converter, selecting a leakage inductance current of a transformer as a diagnosis signal, coding and classifying a fault type based on OC fault states of different power switching devices of the DC/DC converter, and collecting diagnosis signals of the DC/DC converter under different fault states as a sample set;

step 2: improving a global search ability of a sparrow search algorithm by using a Levy flight strategy;

step 3: dividing the sample set into a training set and a test set, preliminarily establishing an architecture of a deep belief network, and initializing network parameters;

step 4: optimizing a quantity of hidden-layer units of the deep belief network by using an improved sparrow search algorithm, and determining a best quantity of hidden-layer units of the network;

step 5: under the best quantity of hidden-layer units, training the deep belief network by using the training set, and testing a trained deep belief network by using the test set; and step 6: inputting a newly obtained test sample into the trained deep belief network directly for fault diagnosis to obtain a diagnosis result.

Further, step 1 in the present disclosure includes:

when establishing the simulation module of the DC/DC converter, simulating an OC fault of a power switching transistor by removing a pulse control signal of the power switching transistor, and then collecting diagnosis signal data of the DC/DC converter under OC faults of different power switching devices as the sample set.

Further, in step 2 in the present disclosure, a Levy flight algorithm records update information of all particle positions based on a flight track, and a calculation formula is:

$$x_i^{t+1}=x_i^t+\alpha\oplus\text{Levy},$$

where $\alpha$ represents a step factor; $\oplus$ represents dot multiplication; $x_i^t$ represents a current position; $x_i^{t+1}$ represent a position of a next state; and Levy represents a direction and step of a flight, which is randomly distributed and is calculated according to the following formula:

$$\text{Levy}\sim|s|^{-\lambda}, 1<\lambda\le 3,$$

where s represents a random step, which is calculated according to the following formula:

$$s=\mu/(|v|^{1/\beta}),$$

where $\beta=1.5$, $\mu=N(0, \sigma_\mu^2)$, and $\sigma_\mu^2$ is calculated according to the following formula:

$$\sigma_\mu = \left[\frac{\Gamma(1+\beta)\times\sin(\pi\times\beta/2)}{\Gamma[(1+\beta)/2]\times\beta\times 2^{(\beta-1)/2}}\right]^{1/\beta}, \sigma_v=1.$$

Further, the sparrow search algorithm in step 2 in the present disclosure is:

a population of the sparrow search algorithm is expressed as X, a quantity of to-be-optimized variables is δ, and a position update formula of a population discoverer is:

$$X_{l,\varphi}^{v+1} = \begin{cases} X_{l,\varphi}^{v} \times \exp\left(-\dfrac{l}{\xi \times C}\right), & R < ST \\ X_{l,\varphi}^{v} + Q \cdot L, & R \geq ST \end{cases}$$

where C represents a maximum quantity of iterations, $X_{l,\varphi}^{v}$ and $X_{l,\varphi}^{v+1}$ respectively represent positions of a first sparrow in a $\varphi^{th}$ dimension in $v^{th}$ and $(v+1)^{th}$ iterations, l=[1, 2, ... , s], $\varphi$=[1, 2, ... δ], s represents a quantity of sparrows, ξ and Q represent random numbers, L represents a 1× unit vector, R represents a current alarm value, ST represents a safety threshold, and there is no predator when R<ST and there is a predator when R≥ST; and a position update formula of a population follower is:

$$X_{l,\varphi}^{v+1} = \begin{cases} Q \cdot \exp\left(\dfrac{X_{worst} - X_{l,\varphi}^{v}}{l^2}\right), & l > \dfrac{s}{2} \\ X_p^{v} + |X_{l,\varphi}^{v} - X_p^{v}| \cdot A^{+} \cdot L, & l \leq \dfrac{s}{2} \end{cases}$$

where $X_p^{v}$ represents a current best position of the discoverer, $X_{worst}$ represents a global worst position. each element of A and L is randomly assigned as 1 or −1, and $A^{+}=A^{T}(AA^{T})^{-1}$; and when the predator appears, behavior of an individual in the population is expressed as follows:

$$X_{l,\varphi}^{v+1} = \begin{cases} X_{best}^{v} + \beta \times |X_{l,\varphi}^{v} - X_{best}^{v}|, & f_v(X_{l,\varphi}^{v}) > f_{v\_best} \\ X_{l,\varphi}^{v} + \zeta \times \dfrac{|X_{l,\varphi}^{v} - X_{best}^{v}|}{(f_v(X_{l,\varphi}^{v}) - f_{v\_worst}) + \varepsilon}, & f_v(X_{l,\varphi}^{v}) = f_{v\_best} \end{cases}$$

where $X_{best}^{v}$ represents a current global best position; β represents a step control random number of a normal distribution, $\zeta \in [-1,1]$ represents a random number of a moving direction of the individual in the population, $f_v(X_{l,}^{v})$ represents a fitness value of a current sparrow individual, and $f_{v\_best}$ and $f_{v\_worst}$ represent current global best and worst fitness values respectively; and then a next iteration is performed based on a calculated best fitness value and global best position.

Further, a method for improving the sparrow search algorithm by using the Levy flight strategy in step 2 includes:

when improving the sparrow search algorithm by using the Levy flight strategy, improving, by using the Levy flight strategy, the behavior of the individual in the population when the predator appears, where an improved calculation formula is:

$$X_{l,\varphi}^{v+1} = \begin{cases} X_{best}^{v} + |X_{l,\varphi}^{v} - X_{best}^{v}| \times \text{Levy}, & \text{if } f_v(X_{l,\varphi}^{v}) > f_{v\_best} \\ X_{l,\varphi}^{v} + \zeta \times \dfrac{|X_{l,\varphi}^{v} - X_{best}^{v}|}{(f_v(X_{l,\varphi}^{v}) - f_{v\_worst}) + \varepsilon}, & \text{if } f_v(X_{l,\varphi}^{v}) = f_{v\_best} \end{cases}$$

where Levy represents the direction and step of the flight, which is randomly distributed.

Further, step 3 in the present disclosure includes:

dividing the sample set into the training set and the test set, and proposing a deep belief network including an input layer, two hidden layers, and an output layer, where the deep belief network is composed of two deep Boltzmann machines, the input layer and a first hidden layer of the deep belief network are a visible layer and a hidden layer of a first deep Boltzmann machine respectively, and the first hidden layer and a second hidden layer of the deep belief network are a visible layer and a hidden layer of a second deep Boltzmann machine respectively.

Further, step 4 in the present disclosure includes:

when optimizing the quantity of hidden-layer units of the deep belief network by using the improved sparrow search algorithm, first initializing parameters of the improved sparrow search algorithm, setting a quantity of hidden layers to a quantity of to-be-optimized variables of the improved sparrow search algorithm, setting an output loss value of the deep belief network to a fitness function of a sparrow population, and searching for a global best position and a global best fitness value based on the fitness function, where the global best position is a combination of best quantities of hidden-layer units searched by the improved sparrow search algorithm; dividing the sparrow population into a discoverer, a follower, and a scouter, calculating a current global best position and a current global best fitness value, performing iterative update to update positions of the discoverer, the follower, and the scouter in turn, and calculating a current best position and a current best fitness value based on the positions of the discoverer, the follower, and the scouter for update; and repeating this process until required iterations are completed, outputting the global best position and the global best fitness value, and taking, as the best quantity of hidden-layer units, a quantity of hidden-layer units that is determined based on the global best position.

Further, a method for training the deep belief network in step 5 in the present disclosure includes:

training, by using the sample set, an optimized deep belief network obtained based on the improved sparrow search algorithm, which includes: dividing the sample set into the training set and the test set based on a certain proportion, performing layer-by-layer pre-training on a restricted Boltzmann machine in an unsupervised greedy manner, and after the layer-by-layer pre-training, fine tuning all parameters of a pre-training model based on a supervised back propagation algorithm to update the parameters of the deep belief network.

The present disclosure provides a DC/DC converter fault diagnosis system based on an improved sparrow search algorithm, including:

a data collection module configured to establish a simulation module of a DC/DC converter, select a leakage inductance current of a transformer as a diagnosis signal, code and classify a fault type based on OC fault states of different power switching devices of the DC/DC converter, and collect diagnosis signals of the DC/DC converter under different fault states as a sample set;

an algorithm optimization module configured to improve a global search ability of a sparrow search algorithm by using a Levy flight strategy;

a network optimization module configured to optimize a quantity of hidden-layer units of a deep belief network by using an improved sparrow search algorithm, and search for a best quantity of hidden-layer units of the network;

a network training module configured to set the quantity of hidden-layer units of the deep belief network as the best quantity of hidden-layer units, train the deep belief network by using the training set, and test a trained deep belief network by using the test set; and a fault diagnosis module configured to input a newly obtained test sample into the trained deep belief network directly for fault diagnosis to obtain a diagnosis result.

The present disclosure provides a computer-readable storage medium that stores a computer program, where the computer program is executed by a processor to implement the steps of the method described above.

The present disclosure achieves the following beneficial effects: The DC/DC converter fault diagnosis method and system based on an improved sparrow search algorithm in the present disclosure improve the global search ability of the sparrow search algorithm by using the Levy flight strategy; optimize the quantity of hidden-layer units of the deep belief network by using the improved sparrow search algorithm obtained based on the Levy flight strategy, to obtain the best quantity of hidden-layer units; and training the optimized deep belief network obtained based on the improved sparrow search algorithm, and obtaining the fault diagnosis result based on the trained network. This improves diagnosis accuracy of the network.

BRIEF DESCRIPTION OF THE DRAWINGS

The present disclosure is described in further detail with reference to the accompanying drawings and embodiments.

DETAILED DESCRIPTION OF THE EMBODIMENTS

To make the objectives, technical solutions, and advantages of the present disclosure clearer, the present disclosure is further described below in detail with reference to the accompanying drawings and embodiments. It should be understood that the specific embodiments described herein are merely intended to explain the present disclosure, rather than to limit the present disclosure. Further, the technical features involved in the various embodiments of the present disclosure described below may be combined with each other as long as they do not constitute a conflict with each other.

Embodiment 1

Figure 1:
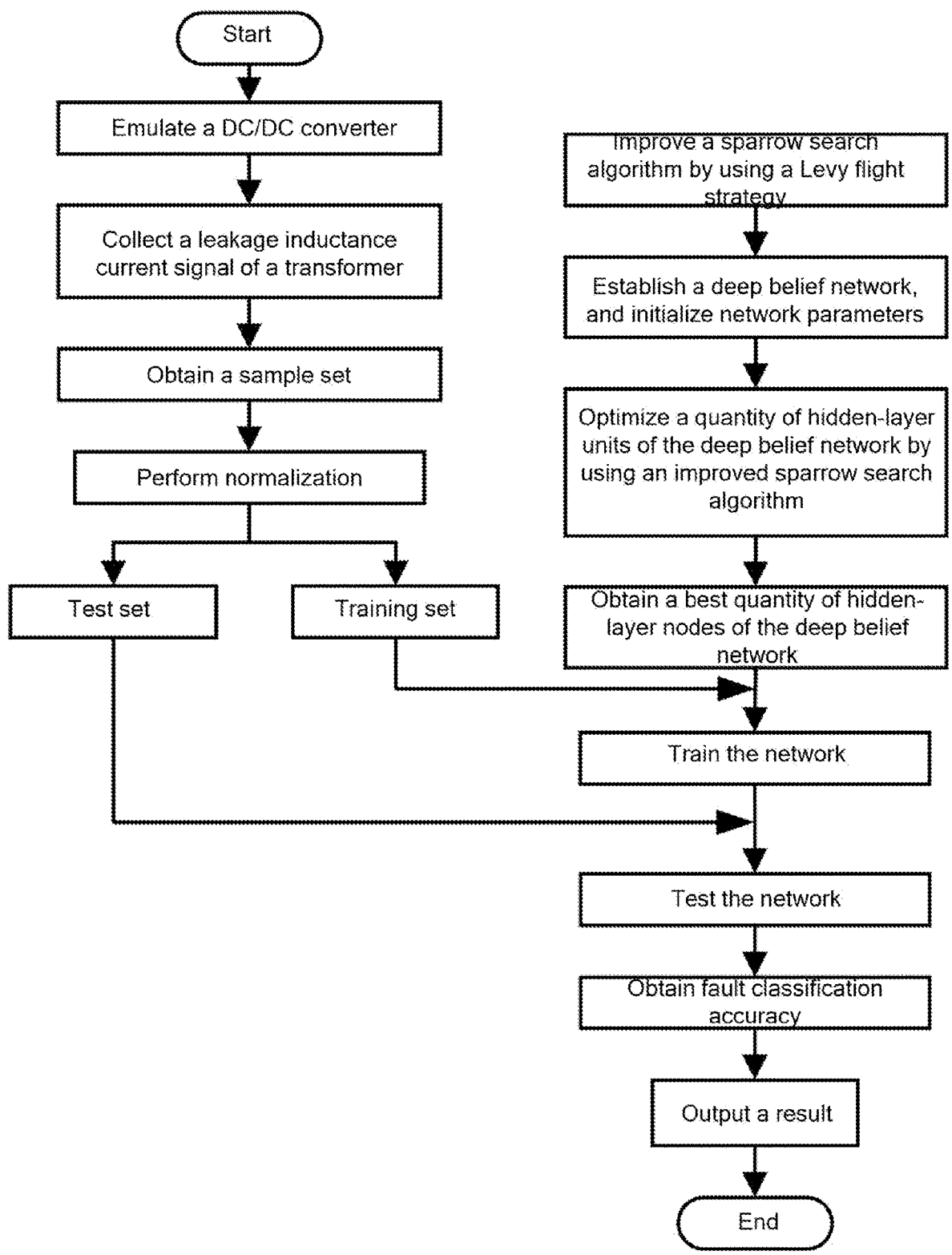
FIG. 1 is a schematic flowchart of a method according to an embodiment of the present disclosure.

FIG. 1 is a schematic flowchart of a method according to this embodiment of the present disclosure. The method shown in FIG. 1 includes the following steps.

Figure 2:
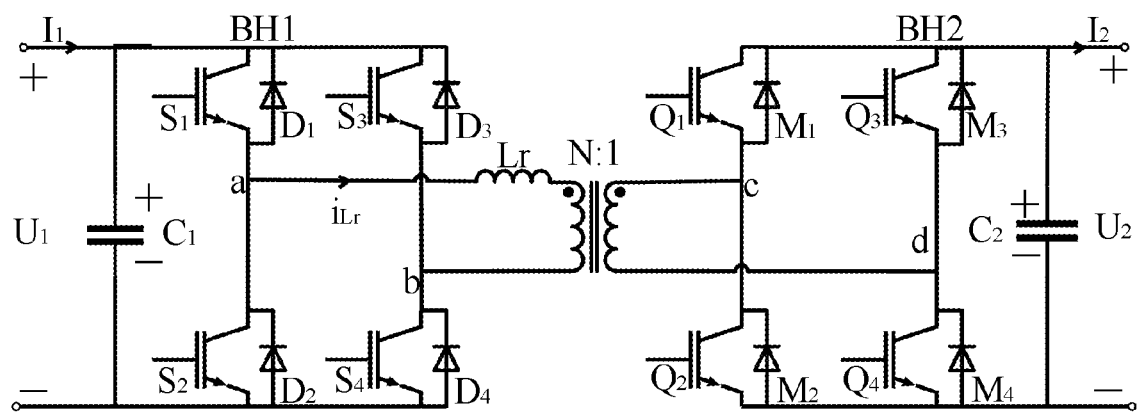
FIG. 2 shows an emulation topology of a dual-active-bridge converter according to an embodiment of the present disclosure.

(1) Establish an simulation module of a dual-active-bridge converter, where an emulation topology is shown in FIG. 2. A leakage inductance current of a transformer is selected as a diagnosis signal, a fault type is coded and classified based on OC fault states of different power switching devices of a DC/DC converter, and diagnosis signals of the DC/DC converter under different fault states are collected as a sample set. The dual-active-bridge converter has a symmetrical structure. Therefore, when an OC fault occurs on power switching transistors in symmetrical positions, waveforms of the leakage inductance current of the transformer are consistent. Therefore, the converter is set to have five fault states, namely, a normal state, a state in which the OC fault occurs on $S_1/S_4$, a state in which the OC fault occurs on $S_2/S_3$, a state in which the OC fault occurs on $Q_1/Q_4$, and a state in which the OC fault occurs on $Q_2/Q_3$. 200 samples are collected for each fault state, and 1000 samples are obtained to form the sample set. The fault states and corresponding codes are shown in Table 1.

TABLE 1

| Fault states and types | |
| --- | --- |
| Fault state | Fault type |
| Normal state | 0 |
| OC fault on $S_1/S_4$ | 1 |
| OC fault on $S_2/S_3$ | 2 |
| OC fault on $Q_1/Q_4$ | 3 |
| OC fault on $Q_2/Q_3$ | 4 |

(2) Improve a global search ability of a sparrow search algorithm by using a Levy flight strategy.

(3) Divide the sample set into a training set and a test set, preliminarily establish an architecture of a deep belief network, and initialize network parameters.

(4) Optimize a quantity of hidden-layer units of the deep belief network by using an improved sparrow search algorithm, and determine a best quantity of hidden-layer units of the network.

(5) Under the best quantity of hidden-layer units, train the deep belief network by using the training set, and test a trained deep belief network by using the test set.

(6) Input a newly obtained test sample into the trained deep belief network directly for fault diagnosis to obtain a diagnosis result.

In this embodiment, step (2) may be implemented in the following manner:

A Levy flight algorithm has a large search range. The Levy flight algorithm records update information of all particle positions based on a flight track, and a calculation formula is:

$$x_i^{t+1} = x_i^t + \alpha \oplus \text{Levy}.$$

In the above formula, $\alpha$ represents a step factor; $\oplus$ represents dot multiplication; $x_i^t$ represents a current position; $x_i^{t+1}$ represent a position of a next state; and Levy represents a direction and step of a flight, which is randomly distributed and is calculated according to the following formula:

$$\text{Levy} \sim |s|^{-\lambda}, 1 < \lambda \leq 3,$$

where s represents a random step, which is calculated according to the following formula:

$$s = \mu/(|v|^{1/\beta}),$$

where $\beta=1.5$, $\mu=N(0, \sigma_\mu^2)$, and $\sigma_\mu^2$ is calculated according to the following formula:

$$\sigma_\mu = \left[\frac{\Gamma(1+\beta) \times \sin(\pi \times \beta/2)}{\Gamma[(1+\beta)/2] \times \beta \times 2^{(\beta-1)/2}}\right]^{1/\beta}, \sigma_v = 1.$$

A population of the sparrow search algorithm may be expressed as X, a quantity of to-be-optimized variables is $\delta$, and a position update formula of a population discoverer is:

$$X_{l,\varphi}^{v+1} = \begin{cases} X_{l,\varphi}^v \times \exp\left(-\dfrac{l}{\xi \times C}\right), & R < ST \\ X_{l,\varphi}^v + Q \cdot L, & R \geq ST \end{cases}.$$

In the above formula, C represents a maximum quantity of iterations, $X_{l,\varphi}^v$ and $X_{l,\varphi}^{v+1}$ respectively represent positions of a first sparrow in a $\varphi^{th}$ dimension in $v^{th}$ and $(v+1)^{th}$ iterations, $l=[1, 2, \ldots s]$, $\varphi=[1, 2, \ldots \delta]$, s represents a quantity of sparrows, $\xi$ and Q represent random numbers, L represents a 1× unit vector, R represents a current alarm value, ST represents a safety threshold, and there is no predator when R<ST and there is a predator when R≥ST. A position update formula of a population follower is:

$$X_{l,\varphi}^{v+1} = \begin{cases} Q \cdot \exp\left(\dfrac{X_{worst} - X_{l,\varphi}^v}{l^2}\right), & l > \dfrac{s}{2} \\ X_p^v + |X_{l,\varphi}^v - X_p^v| \cdot A^+ \cdot L, & l \leq \dfrac{s}{2} \end{cases}.$$

In the above formula, $X_p^v$ represents a current best position of the discoverer, $X_{worst}$ represents a global worst position, each element of A and L is randomly assigned as 1 or −1, and $A^+ = A^T(AA^T)^{-1}$. When the predator appears, behavior of an individual in the population is expressed as follows:

$$X_{l,\varphi}^{v+1} = \begin{cases} X_{best}^v + \beta \times |X_{l,\varphi}^v - X_{best}^v|, & f_v(X_{l,\varphi}^v) > f_{v\_best} \\ X_{l,\varphi}^v + \zeta \times \dfrac{|X_{l,\varphi}^v - X_{best}^v|}{(f_v(X_{l,\varphi}^v) - f_{v\_worst}) + \varepsilon}, & f_v(X_{l,\varphi}^v) = f_{v\_best} \end{cases}.$$

In the above formula, $X_{best}^v$ represents a current global best position. $\beta$ represents a step control random number of a normal distribution, $\zeta \in [-1,1]$ represents a random number of a moving direction of the individual in the population, $f_v(X_{l,}^v)$ represents a fitness value of a current sparrow individual, and $f_{v\_best}$ and $f_{v\_worst}$ represent current global best and worst fitness values respectively. Then, a next iteration is performed based on a calculated best fitness value and global best position.

When the sparrow search algorithm is improved by using the Levy flight strategy, the behavior of the individual in the population when the predator appears is improved by using the Levy flight strategy, where an improved calculation formula is:

$$X_{l,\varphi}^{v+1} = \begin{cases} X_{best}^v + |X_{l,\varphi}^v - X_{best}^v| \times \text{Levy}, & \text{if } f_v(X_{l,\varphi}^v) > f_{v\_best} \\ X_{l,\varphi}^v + \zeta \times \dfrac{|X_{l,\varphi}^v - X_{best}^v|}{(f_v(X_{l,\varphi}^v) - f_{v\_worst}) + \varepsilon}, & \text{if } f_v(X_{l,\varphi}^v) = f_{v\_best} \end{cases}.$$

In the above formula, Levy represents the direction and step of the flight, which is randomly distributed. The improved sparrow search algorithm is tested by using a standard test function. A minimum value of the test function and an optimization result of the sparrow search algorithm are shown in Table 2.

TABLE 2

Test function and result

| Test function | Minimum value | Result obtained by using the sparrow search algorithm | Result obtained by using the improved sparrow search algorithm |
|---|---|---|---|
| $F_1(x) = \sum_{i=1}^{n} x_i^2$ | 0 | 1.76E−6 | 1.18E−15 |
| $F_2(x) = \sum_{i=1}^{n} |x_i| + \prod_{i=1}^{n} |x_i|$ | 0 | 3.61E−5 | 1.9E−7 |

An optimization result of the improved sparrow search algorithm for the test function is closer to 0, which indicates that the improved sparrow search algorithm obtained by using the Levy flight strategy in the present disclosure has a good global search ability.

In this embodiment, step (3) may be implemented in the following manner:

dividing the sample set into the training set and the test set, and preliminarily proposing a deep belief network including an input layer, two hidden layers, and an output layer, where the deep belief network is composed of two deep Boltzmann machines, the input layer and a first hidden layer of the deep belief network are a visible layer and a hidden layer of a first deep Boltzmann machine respectively, and the first hidden layer and a second hidden layer of the deep belief network are a visible layer and a hidden layer of a second deep Boltzmann machine respectively.

Figure 3:
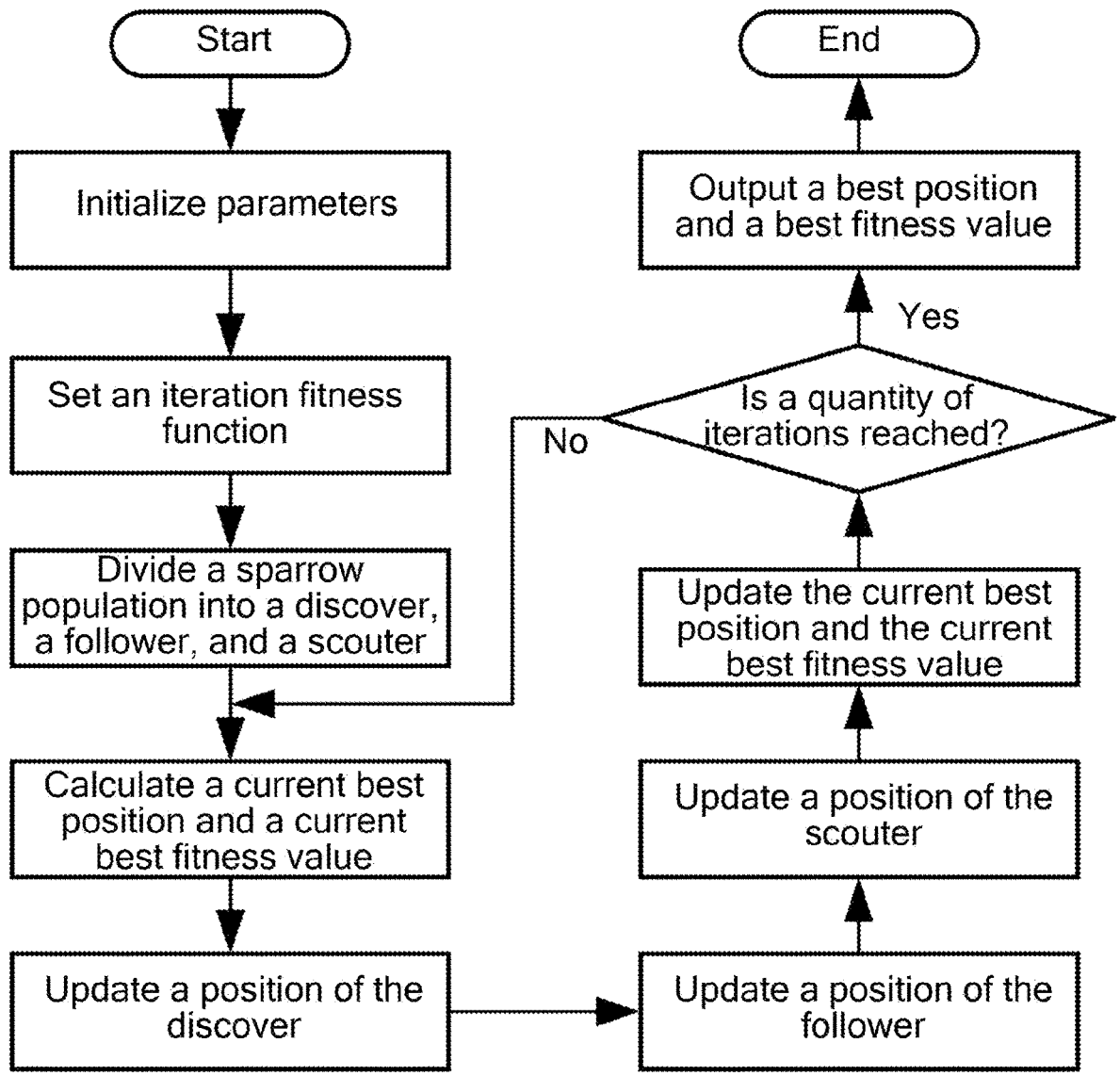
FIG. 3 is a schematic flowchart of improving a sparrow search algorithm according to an embodiment of the present disclosure.
Figure 4:
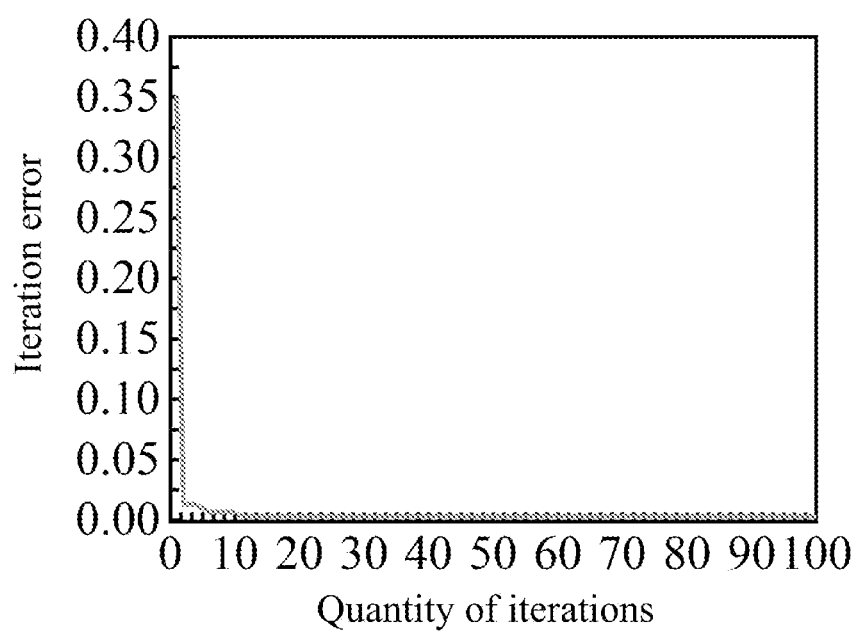
FIG. 4 is an iteration error curve of optimizing a deep belief network by using an improved sparrow search algorithm according to an embodiment of the present disclosure.

In this embodiment, step (4) may be implemented in the following manner:

as shown in FIG. 3 that shows steps of the sparrow search algorithm, when optimizing the quantity of hidden-layer units of the deep belief network by using the improved sparrow search algorithm, first initializing parameters of the improved sparrow search algorithm, setting a quantity of hidden layers to the quantity of to-be-optimized variables of the improved sparrow search algorithm, setting an output loss value of the deep belief network to a fitness function of a sparrow population, and searching for a global best position and a global best fitness value based on the fitness function, where the global best position is a combination of best quantities of hidden-layer units searched by the improved sparrow search algorithm; dividing the sparrow population into a discoverer, a follower, and a scouter, calculating a current global best position and a current global best fitness value, performing iterative update to update positions of the discoverer, the follower, and the scouter in turn, and calculating a current best position and a current best fitness value based on the positions of the discoverer, the follower, and the scouter for update; and repeating this process until required iterations are completed, outputting the global best position and the global best fitness value, and taking, as the best quantity of hidden-layer units, a quantity of hidden-layer units that is determined based on the global best position. An iteration error curve of optimizing the deep belief network by using the improved sparrow search algorithm is shown in FIG. 4. The improved optimization algorithm proposed in the present disclosure has a high search speed and iterative convergence speed.

In this embodiment, step (5) may be implemented in the following manner:

establishing unsupervised training and supervised training for learning of the deep belief network: initializing the parameters of the whole network, performing layer-by-layer pre-training on a restricted Boltzmann machine in an unsupervised greedy manner, and taking an output of a hidden layer of the restricted Boltzmann machine as an input of a visible layer of a lower-layer restricted Boltzmann machine. After the layer-by-layer pre-training, a classifier is added at the top of the deep belief network for supervised training. All parameters (weight and deviation) of a pre-training model are fine tuned based on a supervised back propagation algorithm to refine the whole network.

Specifically, step (5) may be implemented in the following manner:

(5.1) The fault diagnosis of the dual-active-bridge converter includes: step 1: dividing the sample set into the training set and the test set based on a proportion of 7:3, and setting a quantity of input units of the network to 100, a quantity of output units to 5, a learning rate to 0.1, and a quantity of iterations to 100; step 2: setting the parameters of the deep belief network based on the best quantity of hidden-layer units that is searched by the improved sparrow search algorithm, and conducting training and testing; and step 3: calculating classification accuracy, and providing the fault diagnosis result.

(5.2) A fault classification result of the dual-active-bridge converter is shown in Table 3, and compared with fault classification results of a feedback neural network and a support vector machine. A comparison result shows progressiveness of the fault diagnosis of the DC/DC converter in the present disclosure

TABLE 3

Comparison of fault classification results of the dual-active-bridge converter

| Fault type | Feedback neural network | Support vector machine | Optimized deep belief network |
|---|---|---|---|
| Normal state | 95% | 97% | 100% |
| OC fault on $S_1/S_4$ | 97% | 99% | 100% |
| OC fault on $S_2/S_3$ | 98% | 99% | 100% |
| OC fault on $Q_1/Q_4$ | 96% | 98% | 98% |
| OC fault on $Q_2/Q_3$ | 95% | 97% | 100% |

The DC/DC converter fault diagnosis method based on an improved sparrow search algorithm in the present disclosure improves the global search ability of sparrow search algorithm by using the Levy flight strategy, and optimizes the quantity of hidden-layer units of the deep belief network by using the improved sparrow search algorithm, so as to effectively resolve a problem that parameter optimization of the deep belief network and the optimization algorithm fall into a local optimal value, and improve fault diagnosis accuracy of the DC/DC converter.

Embodiment 2

This embodiment of the present disclosure provides a DC/DC converter fault diagnosis system based on an improved sparrow search algorithm, including:

a data collection module configured to establish a simulation module of a DC/DC converter, select a leakage inductance current of a transformer as a diagnosis signal, code and classify a fault type based on OC fault states of different power switching devices of the DC/DC converter, and collect diagnosis signals of the DC/DC converter under different fault states as a sample set;

an algorithm optimization module configured to improve a global search ability of a sparrow search algorithm by using a Levy flight strategy;

a network optimization module configured to optimize a quantity of hidden-layer units of a deep belief network by using an improved sparrow search algorithm, and search for a best quantity of hidden-layer units of the network;

a network training module configured to set the quantity of hidden-layer units of the deep belief network as the best quantity of hidden-layer units, train the deep belief network by using the training set, and test a trained deep belief network by using the test set; and a fault diagnosis module configured to input a newly obtained test sample into the trained deep belief network directly for fault diagnosis to obtain a diagnosis result.

For specific implementations of the above modules, reference may be made to the description of the above method embodiment. Details are not described again in this embodiment.

It should be pointed out that, based on needs of implementation, each step/component described in the present disclosure can be divided into more steps/components, or two or more steps/components or some operations of the steps/components can be combined into a new step/component to achieve the objective of the present disclosure.

It is easy for those skilled in the art to understand that the above-mentioned contents are merely the preferred embodiments of the present disclosure, and are not intended to limit the present disclosure. Any modifications, equivalent substitutions and improvements made within the spirit and principles of the present disclosure should fall within the protection scope of the present disclosure.

What is claimed is:

1. A DC/DC converter fault diagnosis system based on an improved sparrow search algorithm, comprising:

a data collection module configured to establish a simulation module of a DC/DC converter, select a leakage inductance current of a transformer as a diagnosis signal, code and classify a fault type based on open circuit (OC) fault states of different power switching devices of the DC/DC converter, and collect diagnosis signals of the DC/DC converter under different fault states as a sample set;

an algorithm optimization module configured to improve a global search ability of a sparrow search algorithm by using a Levy flight strategy;

a network optimization module configured to optimize a quantity of hidden-layer units of a deep belief network by using an improved sparrow search algorithm, and search for a best quantity of hidden-layer units of the network;

a network training module configured to set the quantity of hidden-layer units of the deep belief network as the best quantity of hidden-layer units, train the deep belief network by using the training set, and test a trained deep belief network by using the test set; and a fault diagnosis module configured to input a newly obtained test sample into the trained deep belief network directly for fault diagnosis to obtain a diagnosis result.

* * * * *